United States Patent
Forrest et al.

(10) Patent No.: US 11,088,338 B2
(45) Date of Patent: *Aug. 10, 2021

(54) EXCITONIC ENERGY TRANSFER TO INCREASE INORGANIC SOLAR CELL EFFICIENCY

(71) Applicants: University of Southern California, Los Angeles, CA (US); The Regents of the University of Michigan, Ann Arbor, MI (US)

(72) Inventors: Stephen R. Forrest, Ann Arbor, MI (US); Mark E. Thompson, Anaheim, CA (US)

(73) Assignees: The Regents of the University of Michigan, Ann Arbor, MI (US); University of Southern California, Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/126,277

(22) Filed: Sep. 10, 2018

(65) Prior Publication Data

US 2019/0259970 A1 Aug. 22, 2019

Related U.S. Application Data

(63) Continuation of application No. 14/429,929, filed as application No. PCT/US2013/061828 on Sep. 26, 2013, now Pat. No. 10,074,820.

(Continued)

(51) Int. Cl.
*H01L 51/42* (2006.01)
*H01L 31/0232* (2014.01)
(Continued)

(52) U.S. Cl.
CPC ...... *H01L 51/422* (2013.01); *H01L 31/02322* (2013.01); *H01L 31/055* (2013.01);
(Continued)

(58) Field of Classification Search
CPC ............... H01L 51/422; H01L 51/0058; H01L 51/0087; H01L 51/4213; H01L 51/0053; H01L 31/02322; H01L 31/055
See application file for complete search history.

(56) References Cited

U.S. PATENT DOCUMENTS 4,106,951 A  8/1978 Masi
4,611,385 A  9/1986 Forrest et al.
(Continued)

FOREIGN PATENT DOCUMENTS

FR  2 583 222 A1  12/1986
JP  H0513794  1/1993

OTHER PUBLICATIONS

Calzaferri et al., "Photonic Antenna System for Light Harvesting, Transport and Trapping," J. Materials Chemistry, vol. 12, No. 20, pp. 1-13 (2001).

(Continued)

*Primary Examiner* — Golam Mowla
(74) *Attorney, Agent, or Firm* — Lempia Summerfield Katz LLC (57) ABSTRACT

The present disclosure relates to a photosensitive optoelectronic device comprising two electrodes, an inorganic subcell positioned between the two electrodes, wherein the inorganic subcell comprises at least one inorganic semiconductor material having a band gap energy ($E_G$), and an organic sensitizing window layer disposed on the inorganic subcell. In one aspect, the organic sensitizing window layer comprises a singlet fission material. In another aspect, the organic sensitizing window layer comprises a singlet fission (Continued)

host and a phosphorescent emitter dopant, where the singlet fission host exhibits an excitation triplet energy ($E_{T-SF}$) greater than or equal to an excitation triplet energy ($E_{T-PE}$) exhibited by the phosphorescent emitter dopant.

18 Claims, 10 Drawing Sheets

Related U.S. Application Data (60) Provisional application No. 61/706,048, filed on Sep. 26, 2012.

(51) Int. Cl.
*H01L 31/055* (2014.01)
*H01L 51/00* (2006.01)

(52) U.S. Cl.
CPC ...... *H01L 51/4213* (2013.01); *H01L 51/0053* (2013.01); *H01L 51/0058* (2013.01); *H01L 51/0087* (2013.01); *Y02E 10/52* (2013.01); *Y02E 10/549* (2013.01)

(56) References Cited

U.S. PATENT DOCUMENTS

| | | |
|---|---|---|
| 5,172,385 A | 12/1992 | Forrest et al. |
| 9,118,026 B2 | 8/2015 | Forrest et al. |
| 2005/0126628 A1* | 6/2005 | Scher ............... B82Y 10/00 136/263 |
| 2007/0131277 A1 | 6/2007 | Gaudiana et al. |
| 2008/0163927 A1* | 7/2008 | Sohn ............... B82Y 10/00 136/263 |
| 2009/0044864 A1* | 2/2009 | Thompson ......... B82Y 10/00 136/263 |
| 2009/0235974 A1 | 9/2009 | Mapel et al. |
| 2010/0006154 A1 | 1/2010 | Kitazawa et al. |
| 2010/0283039 A1* | 11/2010 | Meng ............... B82Y 10/00 257/40 |
| 2012/0118363 A1 | 5/2012 | Forrest et al. |

OTHER PUBLICATIONS

Ehrler et al., "Hybrid pentacene/a-silicon solar cells utilizing multiple carrier generation via singlet exciton fission," Applied Phys. Lett., vol. 101, No. 15, pp. 153507-1 to 153507-3 (2012).

Ehrler et al., "Singlet Exciton Fission-Sensitized Infrared Quantum Dot Solar Cells," Nano Letters, vol. 12, No. 2, pp. 1053-1057 (2012).

Hayashi et al., "Quenching of molecular fluorescence near the surface of a semiconductor," Chem. Phys. Lett., vol. 94, No. 5, pp. 461-466 (1983).

International Search Report and Written Opinion issued in PCT Application No. PCT/US2013/061828, dated Feb. 13, 2014, 11 pages.

International Search Report and Written Opinion issued in PCT Application No. PCT/US2011/051605, dated Jan. 31, 2012, 12 pages.

\* cited by examiner

EXCITONIC ENERGY TRANSFER TO INCREASE INORGANIC SOLAR CELL EFFICIENCY

CROSS-REFERENCE TO RELATED APPLICATIONS

This application is a continuation of U.S. application Ser. No. 14/1429,929, filed Mar. 20, 2015, which is a national stage application under 35 U.S.C. § 371 of International Patent Application No. PCT/US13/61828, filed Sep. 26, 2013, which claims the benefit of U.S. Provisional Application No. 61/706,048 filed Sep. 26, 2012, the disclosures of all of which are incorporated herein by reference.

JOINT RESEARCH AGREEMENT

The subject matter of this application was made by, on behalf of, and/or in connection with one or more of the following parties to a joint university-corporation research agreement: University of Michigan, University of Southern California, and Global Photonic Energy Corporation. The agreement was in effect on and before the date the claimed invention was made, and the claimed invention was made as a result of activities undertaken within the scope of the agreement.

The present disclosure generally relates to optoelectronic devices such as photovoltaic devices and methods of making the same.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability, Present commercially available amorphous silicon cells have stabilized efficiencies between 4 and 8%.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$ff=\{I_{max} V_{max}^a\}/\{I_{SC}V_{OC}\} \quad (1)$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_p$, may be calculated by:

$$\eta_p=\text{ff}*(I_{SC}*V_{OC})/P_{inc}$$

To produce internally generated electric fields that occupy a substantial volume of the semiconductor, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies. The Fermi energy characterizes the statistical occupation of molecular quantum energy states denoted by the value of energy for which the probability of occupation is equal to 1½. A Fermi energy near the conduction band minimum energy indicates that electrons are the predominant carrier. A Fermi energy near the valence band maximum energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

Conventional inorganic semiconductor PV cells employ a p-n junction to establish an internal field. High-efficiency PV devices are typically produced on single crystal growth substrates. These growth substrates may include single crystal wafers, which can be used for creating a perfect lattice and structural support for the epitaxial growth of active layers, also known as "epilayers."

The Shockley and Quiesser thermodynamic limit of maximum efficiency for an inorganic semiconductor solar cell is 31%. The present disclosure utilizes singlet fission materials as a strategy to exceed this basic limit. Singlet fission materials have been investigated for use in organic solar cell structures. That approach employs a molecular species that absorbs blue light and undergoes an excited state (or exciton) cascade to a second molecular level whose energy is approximately half that of the initial excited state. In this manner, two low energy excited states are formed upon absorption of a single high energy photon. The preferred route to this process is to employ a material whose singlet exciton energy is at least twice that of the triplet, thus allowing for singlet fission to readily occur. The present disclosure relates to utilizing such materials in an inorganic solar cell to greatly increase solar energy generation efficiencies.

In a general aspect of the present disclosure, a photosensitive optoelectronic device comprises two electrodes, an inorganic subcell positioned between the two electrodes, wherein the inorganic subcell comprises at least one inorganic semiconductor material having a band gap energy ($E_G$), and an organic sensitizing window layer disposed on the inorganic subcell and in physical contact with the at least one inorganic semiconductor material, wherein the organic sensitizing window layer comprises a singlet fission material.

In some embodiments of the present disclosure, the singlet fission material exhibits an absorptivity of light of at least $10^3$ cm$^{-1}$ at one or more wavelengths ranging from 300 to 700 nm.

In some embodiments, the singlet fission material exhibits an excitation triplet energy ($E_{T-SF}$) substantially matching the band gap energy ($E_G$).

In some embodiments, the singlet fission material has a thickness in the range of 0.5 to 3 μm.

In some embodiments, the singlet fission material has an excitation singlet energy ($E_{S-SF}$) greater than 2.0 eV.

In some embodiments, the inorganic subcell comprises at least one p-n junction.

In some embodiments, the at least one p-n junction comprises at least one semiconducting material chosen from Ge, Si, GaAs, InP, GaN, AlN, CdTe, ZnTe, copper indium gallium (di)selenide (CIGS), and combinations thereof.

In some embodiments, the at least one inorganic semiconductor material comprises a material chosen from III-V materials, Si, Ge, CdTe, ZnTe, and copper indium gallium (di)selenide (CIGS).

In certain embodiments, the at least one inorganic semiconductor material is chosen from GaAs, InP, GaN, AlN, and InGaAs.

In some embodiments, the inorganic subcell comprises at least one p-n junction and an inorganic energy matching layer positioned between the at least one p-n junction and the organic sensitizing window layer, wherein the inorganic energy matching layer comprises the at least one inorganic semiconductor material, wherein the band gap energy ($E_G$) substantially matches an excitation triplet energy ($E_{T-SF}$) of the singlet fission material. In certain embodiments, the at least one inorganic semiconductor material comprises a III-V material. In certain embodiments, the III-V material is $In_xGa_{1-x}As$, wherein x is chosen to provide a band gap energy $E_G$ that substantially matches the excitation triplet energy ($E_{T-SF}$) of the singlet fission material.

In some embodiments, the singlet fission material is chosen from polyacenes, rylenes, rubrenes, and biradicaloids. In certain embodiments, the singlet fission material is chosen from anthracene, tetracene, pentacene, rubrene, and derivatives thereof. In certain embodiments, the singlet fission material is chosen from benzofurans and related compounds.

In another general aspect of the present disclosure, a photosensitive optoelectronic device comprises two electrodes, an inorganic subcell positioned between the two electrodes, wherein the inorganic subcell comprises at least one inorganic semiconductor material having a band gap energy ($E_G$), and an organic sensitizing window layer disposed on the inorganic subcell, wherein the organic sensitizing window layer comprises a singlet fission host and a phosphorescent emitter dopant, the singlet fission host exhibiting an excitation triplet energy ($E_{T-SF}$) greater than or equal to an excitation triplet energy ($E_{T-PE}$) exhibited by the phosphorescent emitter dopant.

In some embodiments, the singlet fission host exhibits an absorptivity of light of at least $10^3$ cm$^{-1}$ at one or more wavelengths ranging from 300 to 700 nm.

In some embodiments, the singlet fission host has an excitation singlet energy ($E_{S-SF}$) greater than 2.0 eV.

In some embodiments, the organic sensitizing window layer has principal absorption bands, wherein the window layer has a thickness selected to transmit <10% of the incident light at wavelengths in the principal absorption bands.

In some embodiments, the singlet fission host is chosen from polyacenes, rylenes, rubrenes, and biradicaloids. In certain embodiments, the polyacenes are anthracene, tetracene, pentacene, and derivatives thereof, and the biradicaloids are benzofurans and related compounds.

In some embodiments, the phosphorescent emitter emits radiation at an energy greater than or equal to the band gap energy ($E_G$).

In some embodiments, the phosphorescent emitter dopant comprises a material chosen from metal porphyrins and phthalocyanines. In certain embodiments, the metal porphyrins are platinum porphyrins. In certain embodiments, the platinum porphyrins are platinum-tetraphenyl-tetrabenzo-porphyrin (PtTPBP), tetraphenyltetranaphto platinum porphyrin (PtTPNP), tetraphenyltetraanthro platinum porphyrin (PtANP), platinum-diphenyltetranaptho-porphyrin (PtDPNP), and derivatives thereof.

In another aspect of the present disclosure, there is disclosed a method of fabricating a photosensitive optoelectronic device comprising depositing an inorganic subcell between two electrodes, wherein the inorganic subcell comprises at least one inorganic semiconductor material having a bandgap ($E_G$), and depositing an organic sensitizing window layer on the inorganic subcell, wherein the organic sensitizing window layer comprises a singlet fission material.

In some embodiments, the inorganic subcell comprises at least one p-n junction and an inorganic energy matching layer positioned between the at least one p-n junction and the organic sensitizing window layer, wherein the inorganic energy matching layer comprises the at least one inorganic semiconductor material, wherein the band gap energy ($E_G$) substantially matches an excitation triplet energy ($E_{T-SF}$) of the singlet fission material. In certain embodiments, the at least one inorganic semiconductor material comprises a III-V material. In certain embodiments, the III-V material is In$_x$Ga$_{1-x}$As, wherein x is chosen to tune the band gap energy $E_G$ to substantially match the excitation triplet energy ($E_{T-SF}$) of the singlet fission material.

In another aspect of the present disclosure, there is disclosed a method of fabricating a photosensitive optoelectronic device comprising depositing an inorganic subcell between two electrodes, wherein the inorganic subcell comprises at least one inorganic semiconductor material having a bandgap ($E_G$), and depositing an organic sensitizing window layer on the inorganic subcell, wherein the organic sensitizing window layer comprises a singlet fission host and a phosphorescent emitter dopant, the singlet fission host exhibiting an excitation triplet energy ($E_{T-SF}$) greater than or equal to an excitation triplet energy ($E_{T-PE}$) exhibited by the phosphorescent emitterdopant.

The foregoing and other features of the present disclosure will be more readily apparent from the following detailed description of exemplary embodiments, taken in conjunction with the attached drawings. It will be noted that for convenience all illustrations of devices show the height dimension exaggerated in relation to the width.

As used herein, the term "singlet fission material" or "singlet fission host" means a material that exhibits an excitation singlet energy ($E_{S-SF}$) and an excitation triplet energy ($E_{T-SF}$) satisfying the following condition: $E_{S-SF} \geq 2E_{T-SF}$. For purposes of satisfying the condition under the present disclosure, an $E_{S-SF}$ within 0.2 eV of $2E_{T-SF}$ is considered "equal to" $2E_{T-SF}$, and thus satisfies the condition.

As used herein, the term "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein the surfaces represent an interpenetrating, entangled or convoluted network with other material(s) or layer(s). Similarly, it should also be understood that a layer may be discontinuous, such that the continuity of the layer along the X-Y dimension may be disturbed or otherwise interrupted by other layer(s) or material(s).

The terms "electrode" and "contact" are used herein to refer to a layer that provides a medium for delivering photo-generated current to an external circuit or providing a bias current or voltage to the device. That is, an electrode, or contact, provides the interface between the active regions of a photosensitive optoelectronic device and a wire, lead, trace or other means for transporting the charge carriers to or from the external circuit. Anodes and cathodes are examples.

As used herein, the term "III-V material" may be used to refer to compound crystals containing elements from group IIIA and group VA of the periodic table. More specifically, the term III-V material may be used herein to refer to compounds which are combinations of the group of Gallium (Ga), Indium (In) and Aluminum (Al), and the group of Arsenic (As), Phosphorous (P), Nitrogen (N), and Antimony (Sb). Representative materials may include GaAs, InP, InGaAs, AlAs, AlGaAs, InGaAsP, InGaAsPN, GaN, InGaN, InGaP, GaSb, GaAlSb, InGaTeP, and InSb and all related compounds.

As described herein, the inorganic subcell is "positioned between" or "deposited between" the two electrodes if it is physically positioned in a manner such that the inorganic subcell is electrically between the two electrodes in that holes flow from the inorganic subcell to one electrode and electrons flow from the inorganic subcell to the opposing electrode.

Figure 1:
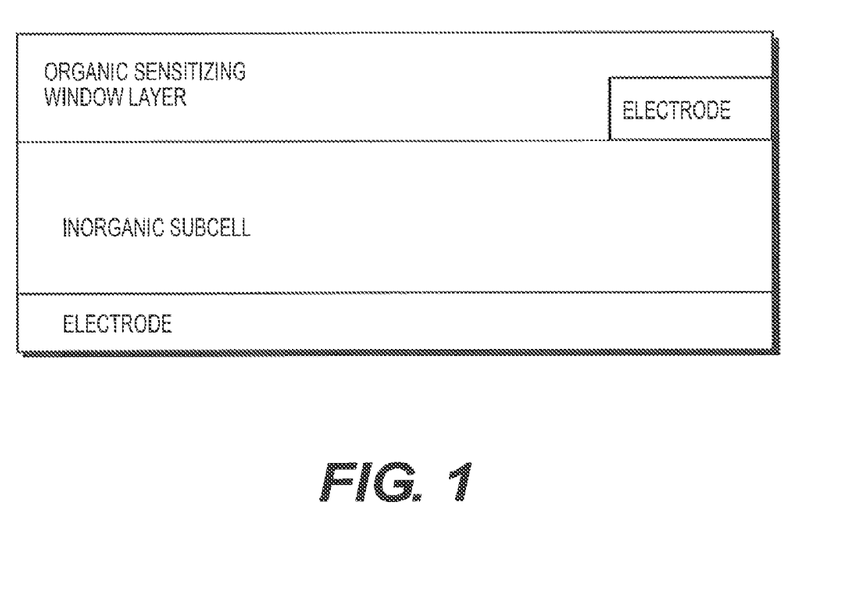
FIG. 1 is a schematic of a non-limiting example of a photosensitive optoelectronic device in accordance with the present disclosure.

The present disclosure relates to a photosensitive optoelectronic device comprising two electrodes, an inorganic subcell positioned between the two electrodes, wherein the inorganic subcell comprises at least one inorganic semiconductor material having a band gap energy ($E_G$), and an organic sensitizing window layer disposed on the inorganic subcell. A non-limiting example of this device is shown in FIG. 1. The organic sensitizing window layer may be in physical contact with the at least one organic semiconductor material having a band gap energy ($E_G$). In some embodiments, the organic sensitizing window layer is not in physical contact with the at least one organic semiconductor material having a band gap energy ($E_G$).

Figure 2:
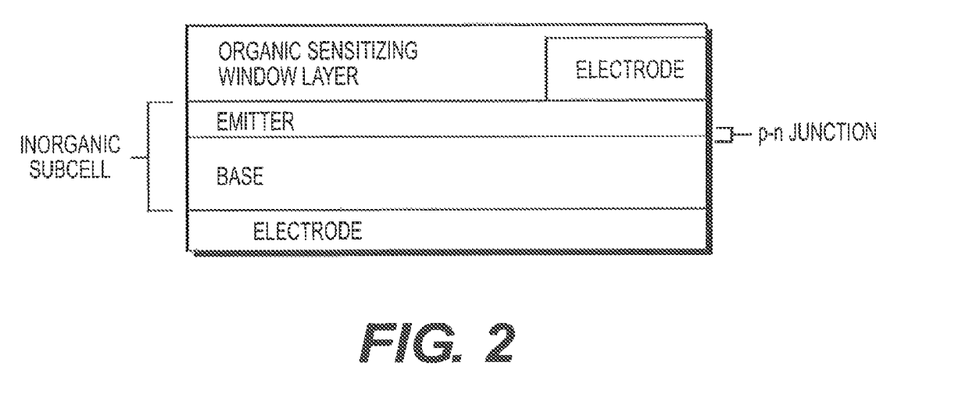
FIG. 2 is a schematic of a non-limiting example of a photosensitive optoelectronic device comprising a p-n junction in accordance with the present disclosure.

The inorganic subcell referred to and depicted herein may comprise a p-n junction, e.g., any p-n junction known in the art for a conventional, high-efficiency inorganic solar cell. This is shown in FIG. 2. While FIG. 2 shows a simple inorganic subcell comprising a base and an emitter forming a p-n junction, it should be appreciated that the inorganic subcell may comprise additional layers as known in the art for an inorganic solar cell and/or that the p-n junction may be oriented in any manner known in the art. The p-n junction may comprise at least one semiconducting material chosen from, for example, III-V materials Ge, Si, CdTe, ZnTe, copper indium gallium (di)delenide (GIGS), and combinations thereof. In some embodiments, the III-V materials are GaAs, InP, GaN, and AlN.

The organic sensitizing window layer as described herein is designed to increase the efficiency of the underlying inorganic subcell.

In one aspect, the organic sensitizing window layer comprises a singlet fission material. The singlet fission material may exhibit an absorptivity of light of at least $10^3$ cm$^{-1}$ at one or more wavelengths ranging from 300 to 700 nm.

In this aspect, upon absorption of light by the singlet fission material, energy transfer to the underlying inorganic subcell occurs by direct Dexter (i.e. non-radiative) transfer of energy from the triplet state of the singlet fission material upon diffusion to the interface of the organic layer and the inorganic subcell. Thus, in some embodiments, the singlet fission material exhibits an excitation triplet energy ($E_{T-SF}$) substantially matching the band gap energy $E_G$ of the at least one inorganic semiconductor material. "Substantially matching" as used throughout this disclosure means an energy difference ≤0.3 eV. In some embodiments, the energy difference is ≤0.2 eV, ≤0.1 eV, or ≤0.05 eV. The singlet/triplet energies of the singlet fission material may be fine-tuned by donor/acceptor and/or nitrogen substitution. In this way, the excitation triplet energy ($E_{T-SF}$) of the singlet fission material may be tuned to substantially match the band gap energy $E_G$ of the at least one inorganic semiconductor layer.

Figure 5:
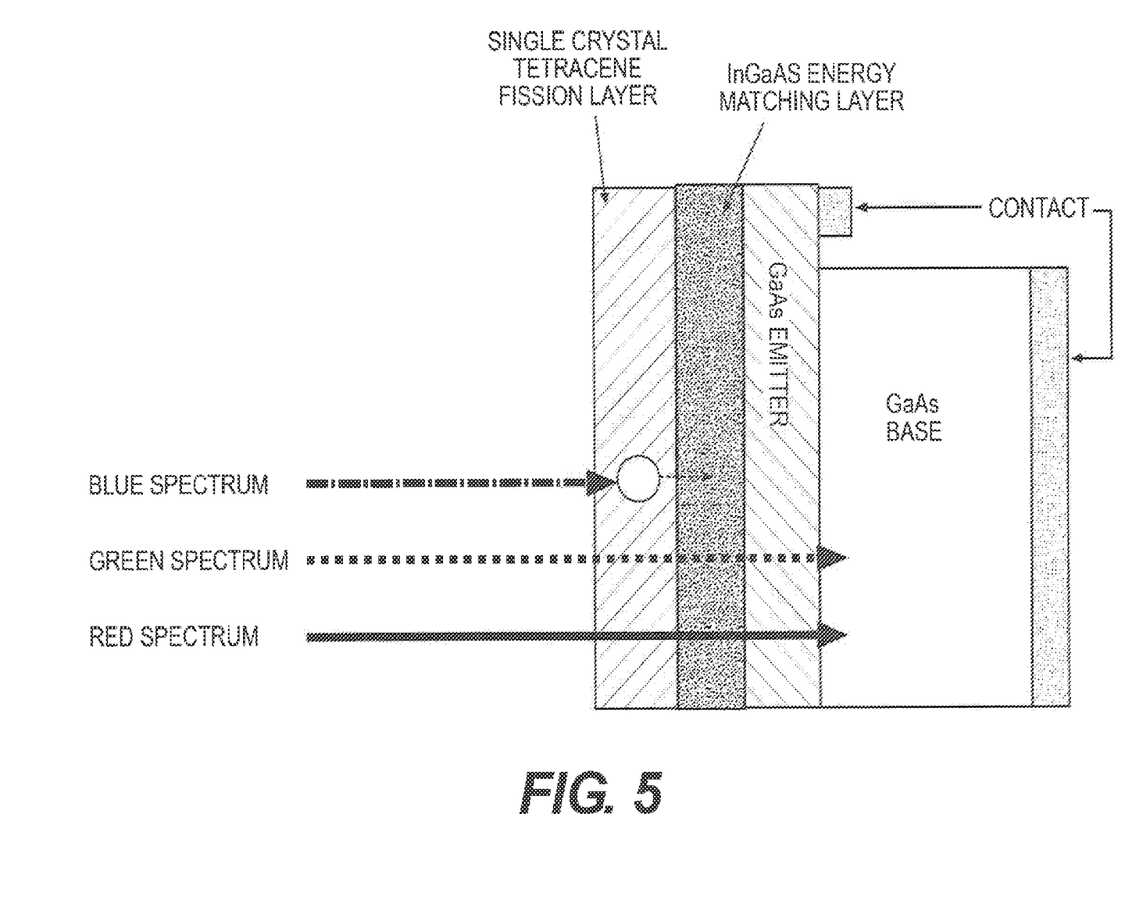
FIG. 5 is a schematic of an exemplary energy matching GaAs solar cell structure. The arrows indicate incident solar radiation. The open circle is the tetracene excited state. The tetracene single crystal is attached by pressure welding to the energy matching surface of the GaAs solar cell grown by molecular beam epitaxy.

Another approach for substantially matching the excitation triplet energy ($E_{T-SF}$) of the singlet fission material with the band gap energy $E_G$ of the at least one inorganic semiconductor material is through the use of an inorganic energy matching layer. Thus, in some embodiments, the inorganic subcell comprises at least one p-n junction and an inorganic energy matching layer positioned between the at least one p-n junction and the organic sensitizing window layer, wherein the inorganic energy matching layer comprises the at least one inorganic semiconductor material. In this embodiment, the band gap energy ($E_G$) of the at least one inorganic semiconductor material can substantially match the excitation triplet energy ($E_{T-SF}$) of the singlet fission material. For example, the inorganic energy matching layer can be chosen to provide a band gap energy $E_G$ that substantially matches the excitation triplet energy ($E_{T-SF}$) of the singlet fission material. The at least one inorganic semiconductor layer may comprise a III-V material. As shown in the non-limiting example in FIG. 5, an In$_x$Ga$_{1-x}$As energy matching layer is positioned between the organic sensitizing window layer and the emitter. By adjusting, for example, the In/Ga concentration from x=0 to 0.2, the bandgap of this ternary can be tuned from 1.42 eV to 1.1 eV. A singlet fission material, e.g., single crystal sheets of tetracene, can be grown by OVPD and directly attached to the InGaAs surface by a technique such as pressure welding. The growth can proceed on template substrates, by nucleation on the cold walls of the OVPD reactor, or can be precipitated from the melt via solution growth.

Figure 3:
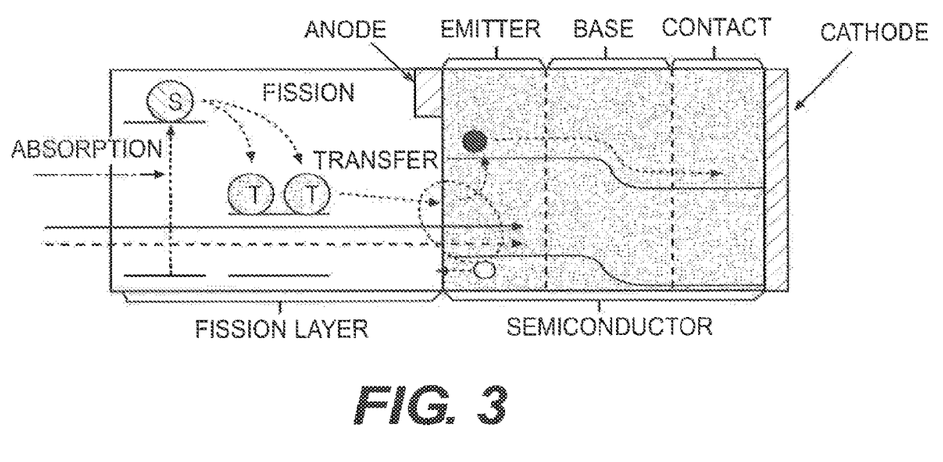
FIG. 3 is a schematic depicting the Dexter energy transfer from the singlet fission material of the organic sensitizing window layer to the inorganic subcell.

The Dexter energy transfer referenced above is shown in FIG. 3. The dashed oval shows the hybrid Wannier-Mott/Frenkel charge transfer state formed by direct Dexter transfer from the singlet fission material to the inorganic subcell, such as a Si cell. As shown, following singlet fission, the triplet exciton diffuses to the interface of the organic layer and the inorganic subcell. There, it couples with the bands of the inorganic semiconductor, e.g., the at least one semiconductor material having a band gap energy ($E_G$), and transfers its energy to weakly bound inorganic exciton states, or directly to the band edge free carrier states. The inorganic excitonic states are rapidly thermalized, creating free carriers. One carrier type is collected at the back contact (emitter) of the cell, and the counter carrier is swept out to the top cell contact.

Figure 4:
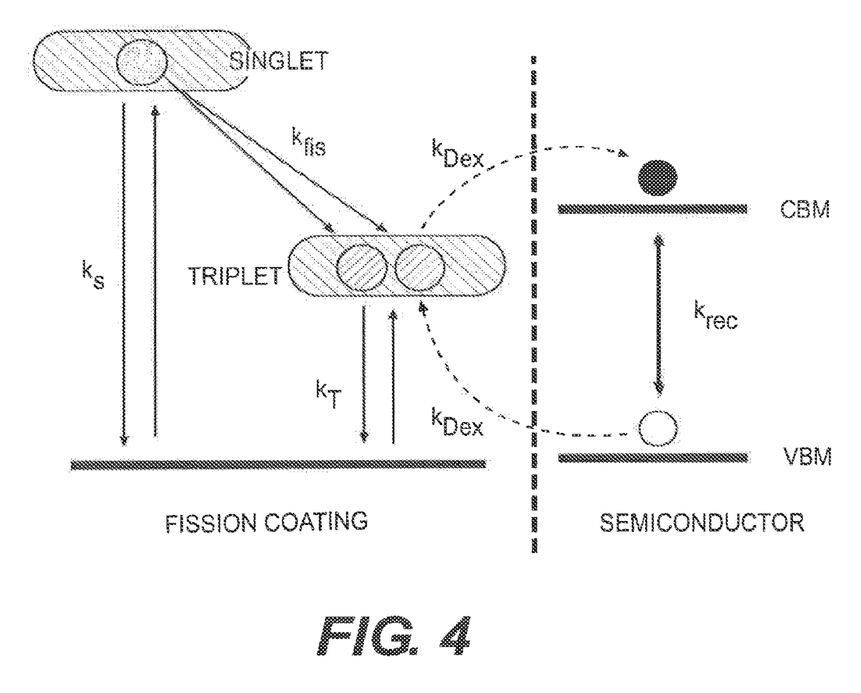
FIG. 4 shows recombination, generation and transfer dynamics of the direct Dexter transfer of triplets to the inorganic subcell following singlet fission. CBM=conduction band minimum, and VBM=valence band maximum.

FIG. 4 also shows the direct energy transfer of a triplet state of the organic material into an inorganic semiconductor. The various rates (k) are defined as follow: $k_{fis}$, is the rates of fission, $k_r$ is the rate of triplet decay, $k_S$ is the rate of singlet decay, $k_{Dex}$, is the rate of Dexter transfer, and $k_{roc}$ is the rate of free carrier recombination in the inorganic semiconductor of the subcell. The "Dexter energy transfer" mechanism will dominate when the excitonic triplet state is non-radiative. The rate of Dexter transfer can be expressed as follows:

$$k_{Dex} = KJ_{i\text{-}f} \exp(-2z/L) \tag{1}$$

where K is a constant, $J_{i\text{-}f}$ is the integral of the overlap between the emission of the triplet state and the absorption of the semiconductor medium (i.e. it is a measure of the orbital energy resonance between the initial and final states of the excited species), z is the distance between the molecule and the semiconductor, and L is the characteristic tunneling distance. In sum, this process involves the coherent and simultaneous transfer of an electron and hole from the initial (organic) to the final (inorganic semiconductor) state over a distance z.

In accordance with equation (1), the free charge generation within the inorganic subcell should occur within a diffusion length, $L_D$, of the inorganic subcell base region. Thus, the emitter layer, e.g., as shown in FIG. 3, should be no thicker than the electron diffusion length. It is also noted that native oxides on the inorganic subcell surface can present a barrier to triplet transfer. Thus, in some embodiments, a surface of the inorganic subcell is stripped by etching, e.g., with HF. Additionally, $CH_3$ terminated surfaces may give improved adhesion/wetting or the organic sensitizing window layer to the inorganic subcell surface, such as a Si surface.

In some embodiments, the thickness of the organic sensitizing window layer is chosen so as not to exceed the triplet diffusion length of the singlet fission material. In certain embodiments, the thickness of the organic sensitizing window layer is in a range of 0.01 to 2 μm, 0.1 to 2 μm, or 0.1 to 1 μm. While the thickness of the organic sensitizing window layer should be chosen so as not to exceed the exciton diffusion length of the singlet fission material to prevent triplet loss to nonradiative decay, this is balanced by the desire to achieve high optical density in the window layer. Thus, in some embodiments, the singlet fission material exhibits long-range crystalline order. In some embodiments, the singlet fission material is a single crystal film. Such crystalline organic materials exhibit long diffusion lengths allowing for thicker organic sensitizing window layers resulting in higher optical densities. Organic materials of long range crystalline order and organic single crystal films may be grown using organic vapor phase deposition (OVPD) techniques known in the art.

In some embodiments, the organic sensitizing window later comprising the singlet fission material is in physical contact with the at least one inorganic semiconductor material of the inorganic subcell. In some embodiments, the organic sensitizing window layer comprising the singlet fission material is within a distance ≤2 nm from the at least one inorganic semiconductor material of the inorganic subcell.

Figure 12:
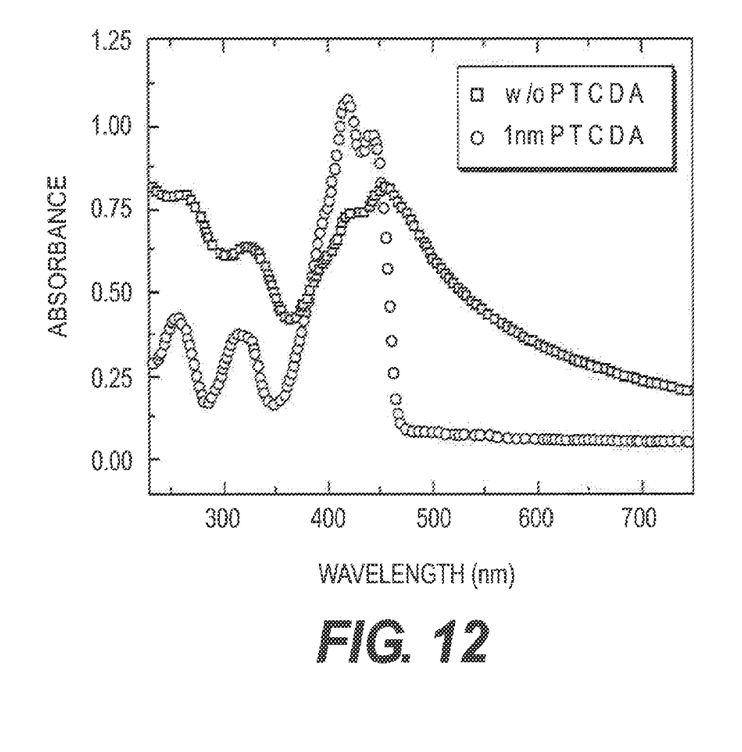
FIG. 12 shows the absorbance of vacuum deposited diphenylisobenzofuran (DPI BF) with and without a PTCDA template layer.

In some embodiments, the singlet fission material can be deposited on the surface of a templating layer, such as a 1 nm thick film of 3,4,9,10-perylenetetracarboxylic dianhydride (PTCDA), to form a continuous film. For example, deposition of diphenylisobenzofuran on the surface of PTCDA can result in a continuous film. Absorbance measurements of the deposited diphenylisobenzofuran film confirms that the film has the same morphology as required for 200% singlet fission efficiency, as shown in FIG. 12.

The singlet fission material may be chosen from materials that satisfy the condition $E_{S\text{-}SF} \geq 2E_{T\text{-}SF}$ as defined above.

Figure 13:
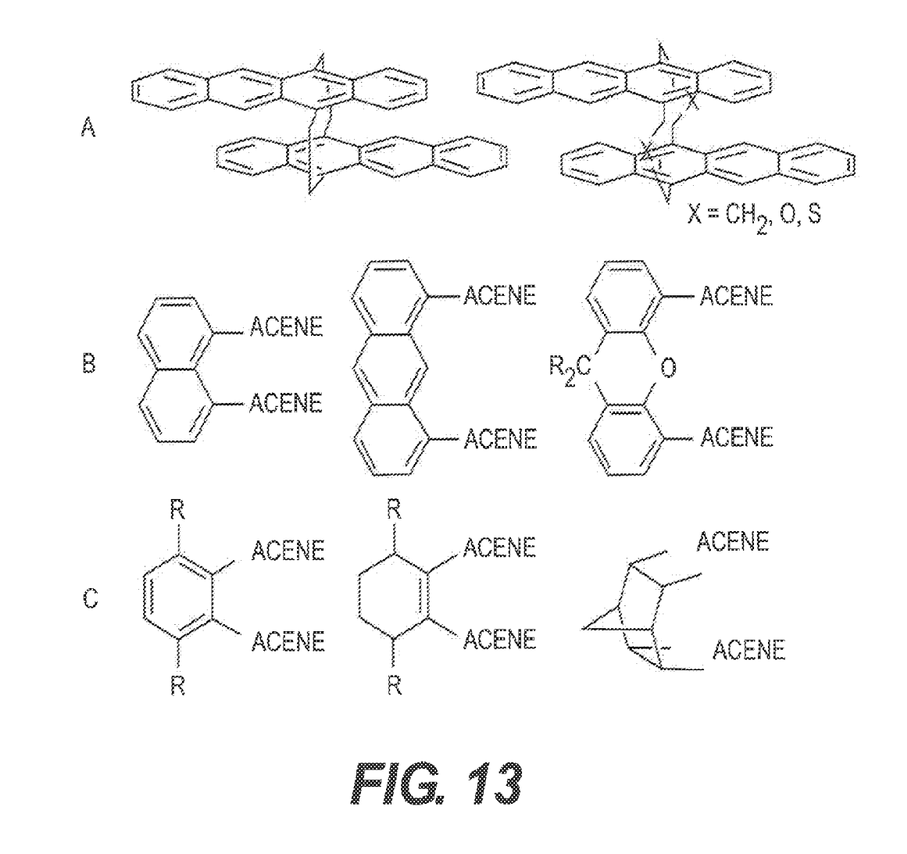
FIG. 13 illustrates linked dimers leading to prompt singlet fission.

Examples of suitable singlet fission materials include polyacenes, rylenes, rubrenes, and biradicaloids. In certain embodiments, the singlet fission material is chosen from anthracene, tetracene ($E_{S\text{-}SF}$=2.3 eV. $E_{T\text{-}SF}$=1.25 eV), pentacene, rubrene, and derivatives thereof. In certain embodiments, the singlet fission material is chosen from benzofurans and related compounds. Dimer molecules of these exemplary materials can also be appropriate for the singlet fission material. For example, a slipped stack arrangement can be formed by preparing acene dimers, such as tetracene dimers, around a cyclophane core as shown in FIG. 13A. Thus, a thick film of covalent dimers, either alone or doped into a host matrix may give prompt and efficient singlet fission. Aromatic linkages may also be employed, as shown in FIG. 13B. In some embodiments, the acenes have close π-contact on an edge but not across a face. Molecules such as those depicted in FIG. 13C have an interacene spacing of close to 3 Å on an edge, but since the π-systems are not coplanar, the balance of each acene is 4-5 Å distant from the other. The R groups shown in FIG. 13 can be used to fine-tune the acene interaction by steric control.

In certain embodiments, the singlet fission materials may be chosen from materials that also satisfy the condition $E_{(T\text{-}SF)2} < 2E_{T\text{-}SF}$, where $E_{(T\text{-}SF)2}$ is the next highest triplet state.

The at least one inorganic semiconductor material as described herein may comprise a material chosen from III-V materials, Si, Ge, CdTe, ZnTe, and copper indium gallium (di)selenide (GIGS). In certain embodiments, the at least one inorganic semiconductor material is chosen from GaAs, InP, GaN, AlN, and InGeAs.

In another aspect, the organic sensitizing window layer comprises a singlet fission host and a phosphorescent emitter dopant, wherein the singlet fission host exhibits an excitation triplet energy ($E_{T\text{-}SF}$) greater than or equal to an excitation triplet energy ($E_{T\text{-}PE}$) exhibited by the phosphorescent emitter dopant. Under the present disclosure, an $E_{T\text{-}SF}$ within 0.2 eV of $E_{T\text{-}PE}$ is considered "equal to" $E_{T\text{-}PE}$. The singlet fission host may exhibit an absorptivity of h of at least $10^3$ cm$^{-1}$ at one or more wavelengths ranging from 300 to 700 nm.

Figure 6A:
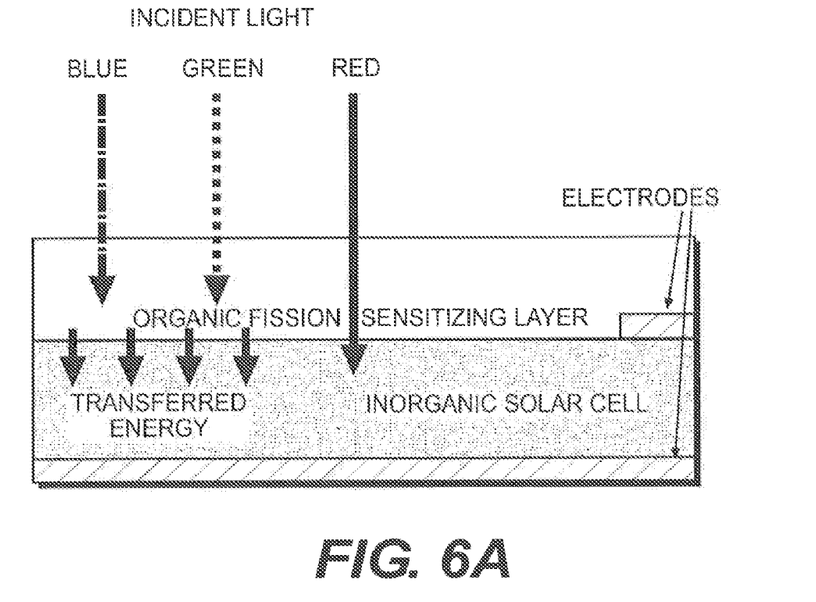
FIGS. 6A and 6B are schematics depicting the singlet fission process whereupon absorption of a high energy photon by the singlet fission host, the host undergoes fission into two triplets, which are transferred to the phosphorescent emitter dopant.
Figure 6B:
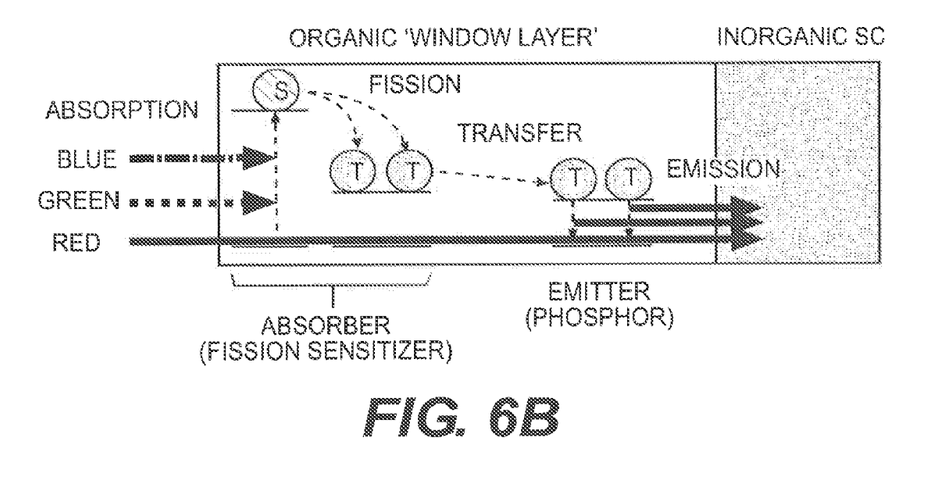

In this aspect, a singlet produced upon the absorption of a high energy photon by the singlet fission host undergoes fission into two triplets, which are transferred to the phosphorescent emitter dopant. This energy process is shown in FIGS. 6A and 6B. As shown in the Figures, one absorbed high energy photon produces two near infrared (NIR) photons emitted from the phosphorescent emitter dopant. The two NIR photons are subsequently absorbed in the inorganic subcell, producing two electrons, which increase the device's efficiency. The improvement in efficiency is limited only by the efficiency of singlet fission, the transfer efficiency of triplet energy from the singlet fission host to the phosphorescent emitter dopant, the phosphorescent efficiency of the emitter dopant, and the coupling efficiency of the emitted photons into the inorganic subcell.

To transfer the triplets of the singlet fission host to the phosphorescent emitter dopant, the excitation triplet energy ($E_{T\text{-}SF}$) of the singlet fission host should be greater than or equal to the excitation triplet energy ($E_{T\text{-}PE}$) of the emitter dopant. In some embodiments, the excitation triplet energy of the singlet fission host substantially matches the excitation triplet energy of the emitter dopant. In addition, the rate of triplet transfer from the singlet fission host to the phosphorescent emitter dopant should be faster than the rate of deactivation of the singlet or triplet excited states of the singlet fission host. The photons emitted from the phosphorescent emitter dopant should be of sufficiently high energy to be absorbed in the active region of the underlying inorganic subcell. Thus, in some embodiments, the phosphorescent emitter emits radiation at an energy greater than or equal to the band gap energy ($E_G$) of the at least one inorganic semiconductor material.

Figure 10:
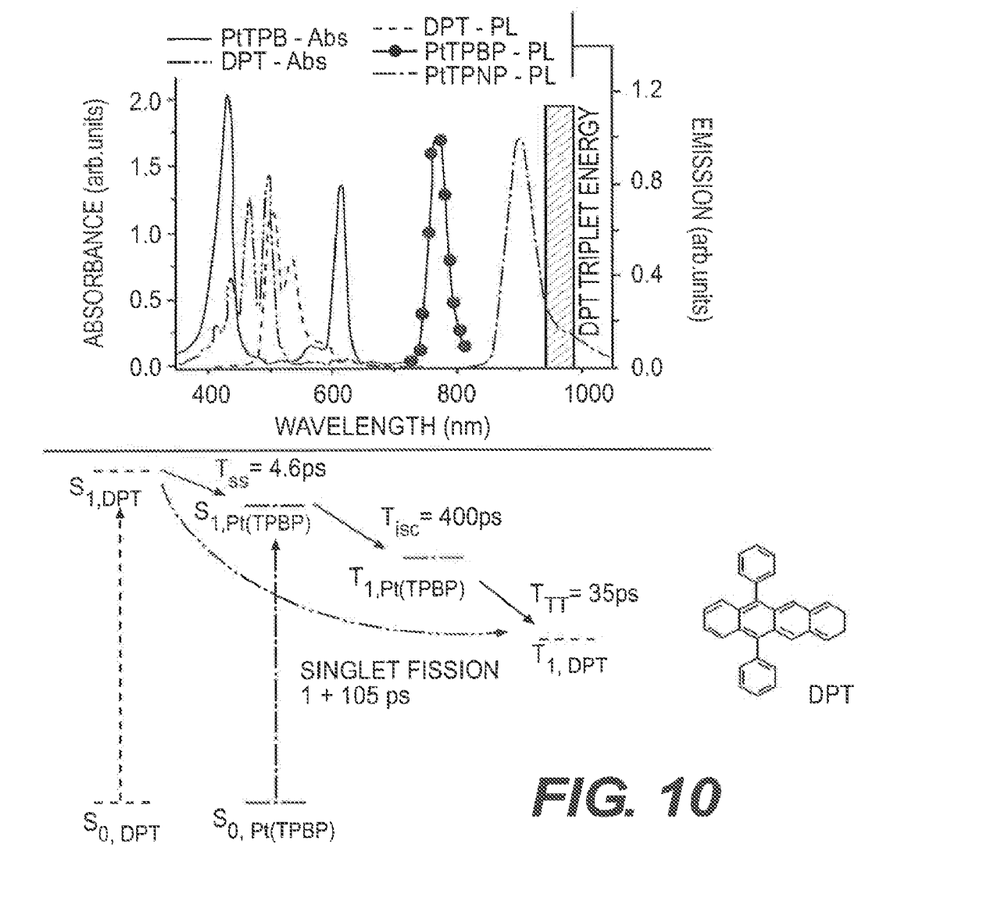
FIG. 10 shows absorption and emission spectra of DPT and PtTPBP, as well as transitions and their rates in the DPT/PtTPBP system determined by ultrafast spectroscopy.

FIG. 10 shows the kinetics of energy transfer between 5,12-diphenyltetracene (DPT), a singlet fission host, and a phosphorescent material: platinum-tetraphenyl-tetrabenzoporphyrin (PtTPBP). Although unmodified PtTPBP has a higher triplet energy than the singlet fission host DPT, indicating that this pair of materials may not be a suitable combination of host and dopant, this material combination, as shown in the ultrafast spectroscopy data of FIG. 10, does confirm that the kinetics of energy transfer between singlet fission hosts and phosphorescent dopants are compatible, i.e., the phosphorescent dopant does not hinder prompt singlet fission, and the rate of triplet exchange between the two materials is rapid. The short transfer times (35 ps) observed for triplet transfer between PtTPBP and DPT suggest that energy transfer to the phosphor is much more rapid than direct decay from either the singlet or triplet manifolds to the ground state. Also, the rate of triplet fusion in DPT is markedly lower than the fission rate, such that the equilibrium singlet ($S_1$) to triplet state ($T_1$) reaction, $S_1 + S_0 \leftrightarrow 2\, T_1$, is strongly preferred.

Figure 7A:
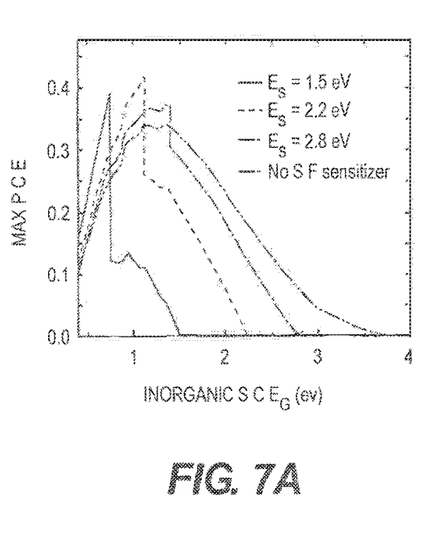
FIG. 7A charts theoretical calculations of power conversion efficiency (PCE) of an inorganic solar cell with bandgap $E_G$ utilizing an organic sensitizing window layer in accordance with the present invention, and FIG. 7B charts theoretical calculations of optimized inorganic solar cell EG for a given fission sensitizer $E_{S-SF}$, and corresponding PCE limit.
Figure 7B:
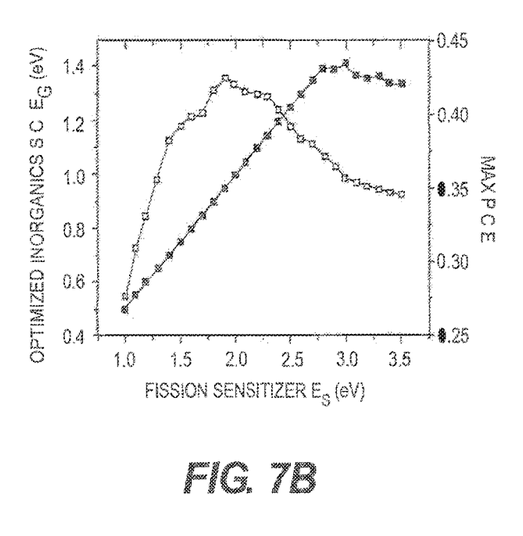

The maximum power conversion efficiency (PCE) can be modeled for a system based on singlet fission-sensitized phosphorescence coupled to an inorganic subcell of bandgap $E_G$. The upper limit to total system efficiency is defined by assuming that 100% of photons with energy $>E_{S\text{-}SF}$ are absorbed by the singlet fission host and subsequently emitted at $E_{T\text{-}PE}$ with 200% quantum efficiency. FIG. 7A shows the calculated PCE of an inorganic solar cell with bandgap $E_G$, utilizing an organic sensitizing window layer with singlet fission host singlet energy of $E_{S\text{-}SF}$, and phosphorescent emitter dopant triplet energy of $E_{T\text{-}PE} = \frac{1}{2}\, E_{S\text{-}SF}$. As shown in FIG. 7A, the abrupt increase when EG is decreased below ET-PE is due to the onset of absorption due to fission-sensitized phosphorescence. FIG. 7B shows the calculated optimized inorganic solar cell $E_G$ for a given $E_{S\text{-}SF}$ (left axis, assuming $E_{T\text{-}PE} = \frac{1}{2}\, E_{S\text{-}SF}$), and the corresponding PCE limit (right axis). For a given $E_G$, the PCE peaks at the optimized $E_{S\text{-}SF}$ (FIG. 7B, left axis). Thus, PCE reaches a maximum when $E_G \sim 1$ eV (i.e. close to 1.1 eV for Si) and $E_{S\text{-}SF} \sim 2$ eV (FIG. 7B, right axis).

Figure 8:
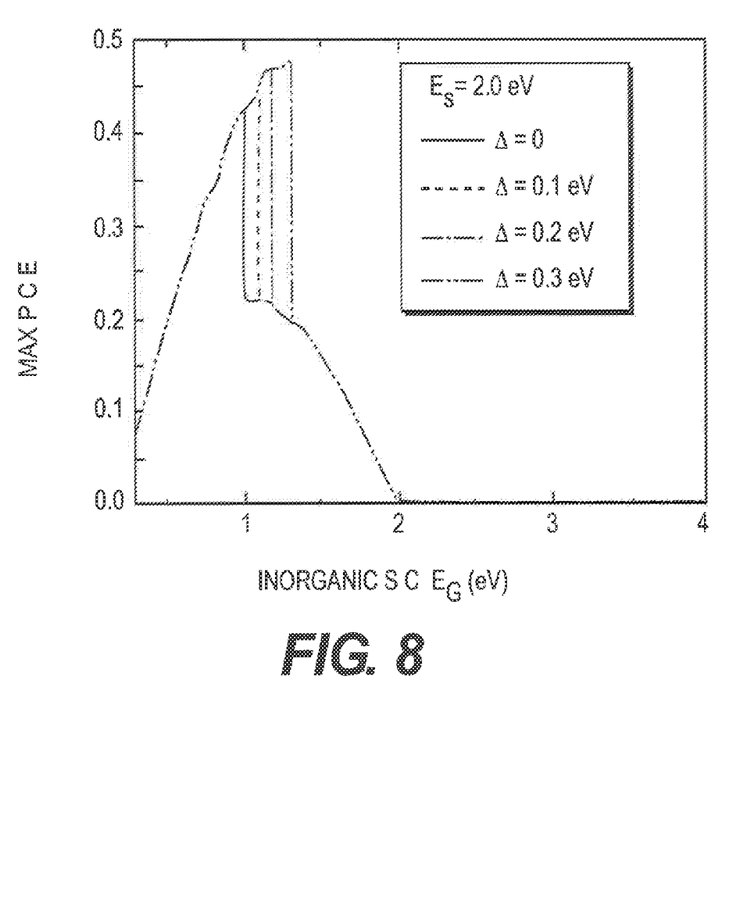
FIG. 8 charts theoretical calculations of maximum PCE when considering the endothermic processes in fission sensitized phosphorescence.

It has been shown that triplet transfer from the singlet fission host to the phosphorescent emitter dopant can be highly efficient even if the process is endothermic with an energy difference as large as 0.1 eV. Also, singlet fission can be endothermic by as much as 0.2 eV and still proceed with high efficiency. Thus, the overall process considers both endothermic processes such that the total endothermic energy barrier is defined as $A = E_{T\text{-}PE} - \frac{1}{2}\, E_{S\text{-}SF}$. The result is shown in FIG. 8, where the maximum PCE is enhanced to 44.5%, 46.5%, and 47.5% when A=0.1 eV, 0.2 eV and 0.3 eV, respectively. The energy difference is compensated by high energy photons prevalent in organic molecules. For example, the C—C stretch energy is ~0.11 eV, and hence A=0.3 eV is well within the energy range that leads to efficient endothermic transfer and fission.

The presence of endothermic transfer shifts the optimum band gap of the underlying inorganic subcell to commensurately higher voltages. For example, at A=0.3 eV, the maximum efficiency is achieved for $E_G$=1.3 eV. This is only slightly lower than that of GaAs (where $E_G$=1.42 eV). Thus, in some embodiments, the inorganic subcell comprises at least one p-n junction and an inorganic energy matching layer positioned between the at least one p-n junction and the organic sensitizing window layer, wherein the inorganic energy matching layer comprises the at least one inorganic semiconductor material. In this embodiment, the band gap energy ($E_G$) of the inorganic energy matching layer can be tuned to optimize the PCE for a given single fission host/phosphorescent emitter dopant pair. The at least one inorganic semiconductor material may comprise a III-V material. As shown in the non-limiting example in FIG. 5, an $In_xGa_{1-x}As$ energy matching layer is positioned between the organic sensitizing window layer and the emitter of the inorganic subcell. The band gap of the matching layer can be tuned by varying x, i.e., varying the In/Ga concentration as discussed above.

Figure 9:
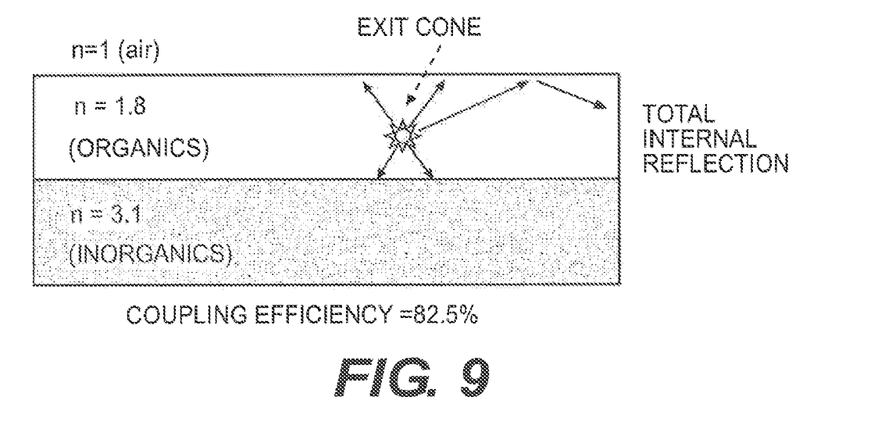
FIG. 9 depicts the outcoupling process from a singlet fission coating.

One significant potential loss mechanism s the outcoupling process from the window layer. The loss is due to outcoupling from triplet remission into $4\pi$ solid angle from the phosphorescent emitter dopant as shown in FIG. 9. The coupling efficiency is ultimately determined by the exit cone defined by the critical angle for total internal reflection at the organic/air interface. For most organics (index of refraction ~2), a coupling efficiency into the inorganic subcell of ~83% is expected. The use of an anti reflective coating on top of the organic sensitizing window layer may efficiently couple the UV-green region of the solar spectrum into the organic layer. The thickness of the organic layer may be tuned to enhance coupling of the red-IR region of the solar spectrum directly into the inorganic subcell. Without employing such techniques to reduce outcoupling, based on these estimates, the upper limit PCE is 0.83×47%=39%.

In some embodiments, the organic sensitizing window layer comprising the singlet fission host and the phosphorescent emitter dopant is in physical contact with the at least one inorganic semiconductor material of the inorganic subcell. In some embodiments, the organic sensitizing window layer comprising the singlet fission host and the phosphorescent emitter dopant is within a distance several microns, e.g., 5 microns, from the at least one inorganic semiconductor material of the inorganic subcell. The organic sensitizing window layer comprising the singlet fission host and the phosphorescent emitter dopant may have a thickness in the range of 0.1 to 2 μm.

The singlet fission host may be chosen from materials that satisfy the condition $E_{S\text{-}SF} \leq 2E_{T\text{-}SF}$ as defined above. Examples of suitable singlet fission materials include polyacenes, rylenes, rubrenes, and biradicalocis. In some embodiments, the polyacenes are anthracene, tetracene, pentacene, and derivatives thereof, and the biradicaloids are benzofurans and related compounds. Dimer molecules of these exemplary materials can also be appropriate for the singlet fission host. For example, a slipped stack arrangement can be formed by preparing acene dimers, such as tetracene dimers, around a cyclophane core as shown in FIG. 13A. Thus, a thick film of covalent dimers, either alone or doped into a host matrix may give prompt and efficient singlet fission. Aromatic linkages may also be employed, as shown in FIG. 13B. In some embodiments, the acenes have close π-contact on an edge but not across a face. Molecules such as those depicted in FIG. 13C have an interacene spacing of close to 3 Å on an edge, but since the π-systems are not coplanar, the balance of each acene is 4-5 Å distant from the other. The R groups shown in FIG. 13 can be used to fine-tune the acene interaction by steric control.

In certain embodiments, the singlet fission host comprises 5,12-diphenyltetracene (DPT) or derivatives thereof. In other embodiments, the singlet fission host comprises diphenylisobenzofuran or derivatives thereof. In some embodiments, the singlet fission host exhibits an excitation singlet energy $E_{S-SF}$ greater than 2.0 eV. In certain embodiments, the singlet fission host may be chosen from materials that also satisfy the condition $E_{(T-SF)2} > 2E_{T-SF}$, where $E_{(T-SF)2}$ is the next highest triplet state of the singlet fission host.

Figure 11:
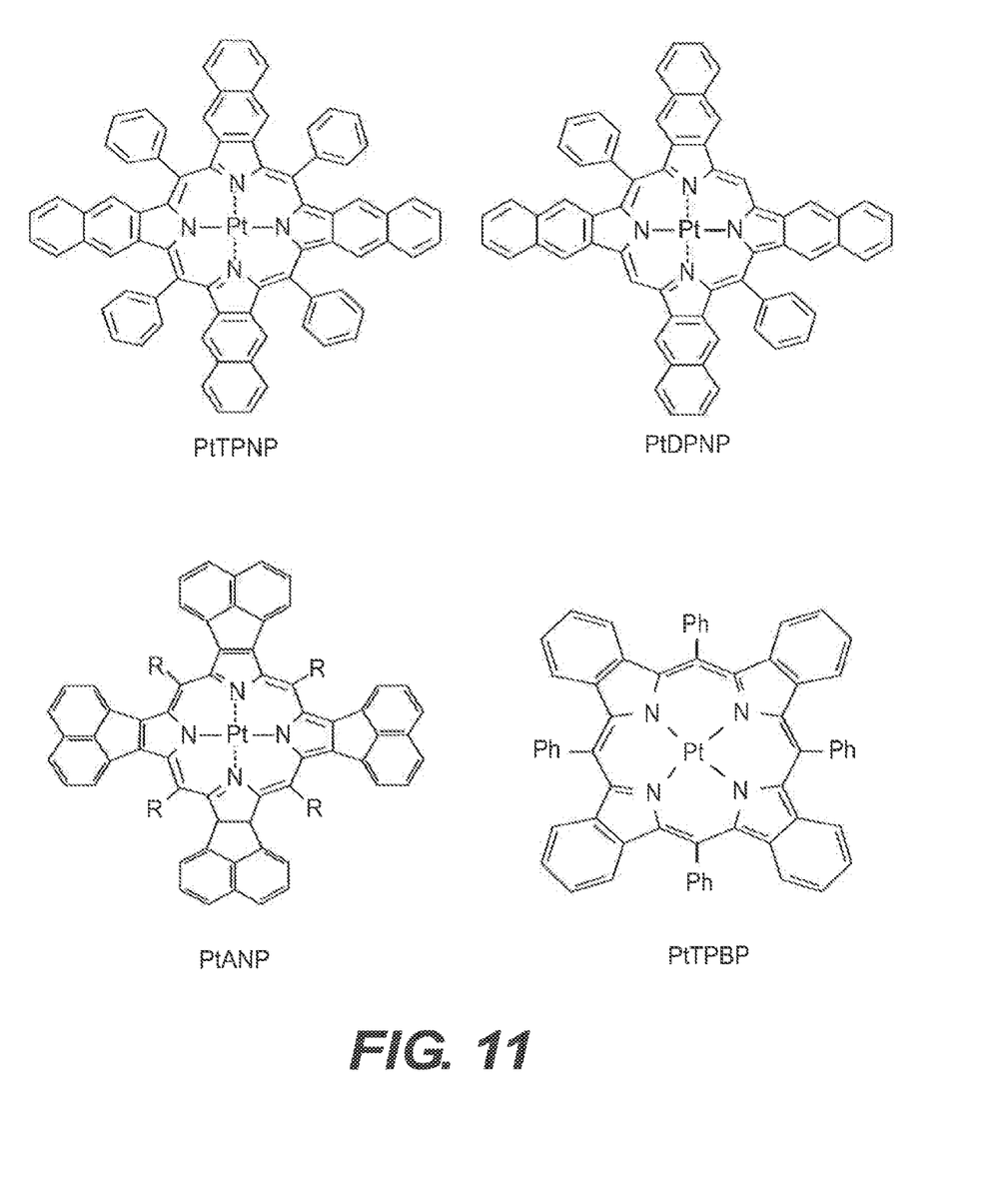
FIG. 11 shows examples of platinum based porphyrin emitters.

The phosphorescent emitter dopant may be chosen to emit radiation in the red/NIR spectral region. In some embodiments, the phosphorescent emitter dopant exhibits highest phosphorescence efficiencies in the red/NIR spectral region. The phosphorescent emitter dopant may comprise, for example, an organometallic material. In some embodiments, the phosphorescent emitter dopant comprises a material chosen from metal porphyrins and phthalocyanines. The metal porphyrins may be chosen from, for example, platinum porphyrins. In certain embodiments, the platinum porphyrins are platinum-tetraphenyl-tetrabenzo-porphyrin (PtTPBP), tetraphenyltetranaptho platinum porphyrin (PtTPNP), tetraphenyltetraanthro platinum porphyrin (PtANP), platinum-diphenyltetranapto-porphyrin (PtDPNP), and derivatives thereof. FIG. 11 shows the structure of these non-limiting examples of platinum porphyrins.

In some embodiments, the triplet excitation energy ($E_{T-PE}$) of candidate phosphorescent emitter dopants may be suitably tuned for use with a singlet fission host. As described above, the excitation triplet energy ($E_{T-SF}$) of the singlet fission host should be greater than or equal to the excitation triplet energy ($E_{T-PE}$) of the phosphorescent emitter dopant, so that the triplet localizes on the phosphorescent emitter dopant and not the singlet fission host. For example, extending conjugation at the benzopyrole rings as shown for the naptho-fused materials in FIG. 11 shifts the triplet energy of the PtTPBP to wavelengths of 900-1000 nm. A similar emission energy is expected for acenaphthalene derivative, PtANP, in FIG. 11.

In some embodiments, deuterium is substituted for hydrogen in the phosphorescent emitter dopant to increase phosphorescence yields. In certain embodiments, deuterium is substituted for hydrogen in the metal porphyrin based dopants.

In a specific embodiment, the singlet fission host is diphenylisobenzofuran ($E_{S-SF}$=2.76 eV, $E_{T-SF}$=1.4 eV) and the phosphorescent emitter dopant is PtTPNP (E-T-PE=1.38 eV).

In some embodiments, the blend of singlet fission host and phosphorescent emitter dopant can be deposited on the surface of a templating layer, such as a 1 nm thick film of 3,4,9,10-perylenetetracarboxylic dianhydride (PTCDA), to form a continuous film. The deposition, for example, of diphenylisobenzofuran on the surface of PTCDA is described above and results are shown in FIG. 12.

In some embodiments, the ratio of singlet fission host to phosphorescent emitter dopant in the organic sensitizing window layer may range from 10:1 to 1:1.

The two electrodes referenced herein may comprise an anode and a cathode. Electrode materials known in the art may be used. Examples include Al, Ag, Au, Cu, or other common metals and inorganic compounds such as oxides, e.g. indium tin oxide (ITO), fluorine doped tin oxide (FTO) gallium doped zinc oxide, or metal halides, e.g. CuI.

In another aspect of the present disclosure, there is disclosed a method of fabricating a photosensitive optoelectronic device comprising depositing an inorganic subcell between two electrodes, wherein the inorganic subcell comprises at least one inorganic semiconductor material having a bandgap ($E_G$), and depositing an organic sensitizing window layer on the inorganic subcell, wherein the organic sensitizing window layer comprises a singlet fission material.

The inorganic subcell may be deposited according to techniques known in the art for fabricating inorganic solar cells. In some embodiments, the inorganic subcell is deposited by gas-source molecular beam epitaxy.

The organic sensitizing window layer may be deposited on the inorganic subcell by vapor phase methods, for example, vacuum thermal evaporation or organic vapor phase deposition. The organic sensitizing window layer may also be deposited by solution based methods, such as spin coating, spray coating, gravure printing, ink-jet printing, and other solution based methods.

In some embodiments, the inorganic subcell comprises at least one p-n junction and an inorganic energy matching layer positioned between the at least one p-n junction and the organic sensitizing window layer, wherein the inorganic energy matching layer comprises the at least one inorganic semiconductor material, wherein the band gap energy ($E_G$) substantially matches an excitation triplet energy ($E_{T-SF}$) of the singlet fission material. In certain embodiments, the at least one inorganic semiconductor material comprises a III-V material. In certain embodiments, the III-V material is $In_xGa_{1-x}As$, wherein x is chosen to tune the band gap energy $E_G$ to substantially match the excitation triplet energy ($E_{T-SF}$) of the singlet fission material.

In another aspect of the present disclosure, there is disclosed a method of fabricating a photosensitive optoelectronic device comprising depositing an inorganic subcell between two electrodes, wherein the inorganic subcell comprises at least one inorganic semiconductor material having a bandgap ($E_G$), and depositing an organic sensitizing window layer on the inorganic subcell, wherein the organic sensitizing window layer comprises a singlet fission host and a phosphorescent emitter dopant, the singlet fission host exhibiting an excitation triplet energy ($E_{T-SF}$) greater than or equal to an excitation triplet energy ($E_{T-PE}$) exhibited by the phosphorescent emitter dopant.

Unless otherwise indicated, all numbers expressing quantities of ingredients, reaction conditions, and other properties or parameters used in the specification are to be understood as being modified in all instances by the term "about." Accordingly, unless otherwise indicated, it should be understood that the numerical parameters set forth in the following specification and attached claims are approximations. At the very least, and not as an attempt to limit the application of the doctrine of equivalents to the scope of the claims, numerical parameters should be read in light of the number of reported significant digits and the application of ordinary rounding techniques.

Other embodiments of the invention will be apparent to those skilled in the art from consideration of the specification and practice of the invention disclosed herein. It is intended that the specification be considered as exemplary only, with a true scope and spirit of the invention being indicated by the following claims.

What is claimed is:

1. A photosensitive optoelectronic device comprising:
   two electrodes;
   an inorganic subcell positioned between the two electrodes, wherein the inorganic subcell comprises at least one inorganic semiconductor material having a band gap energy ($E_G$); and
   an organic sensitizing window layer disposed on the inorganic subcell and in physical contact with the at least one inorganic semiconductor material, wherein the organic sensitizing window layer comprises a singlet fission material and a phosphorescent emitter dopant, wherein the organic sensitizing window layer has a thickness in the range of 0.1 to 2 μm such that the thickness does not exceed a triplet diffusion length of the singlet fission material, and wherein the phosphorescent emitter dopant emits radiation at an energy greater than or equal to the band gap energy ($E_G$) of the at least one inorganic semiconductor material such that photons emitted from the phosphorescent emitter dopant are absorbed by the inorganic subcell.

2. The device of claim 1, wherein the singlet fission material exhibits an absorptivity of light of at least $10^3$ cm$^{-1}$ at one or more wavelengths ranging from 300 to 700 nm.

3. The device of claim 1, wherein the singlet fission material exhibits an excitation triplet energy ($E_{T-SF}$) substantially matching the band gap energy ($E_G$).

4. The device of claim 1, wherein the inorganic subcell comprises at least one p-n junction.

5. The device of claim 4, wherein the at least one p-n junction comprises at least one semiconducting material chosen from Ge, Si, GaAs, InP, GaN, AlN, CdTe, ZnTe, copper indium gallium (di)selenide (CIGS), and combinations thereof.

6. The device of claim 1, wherein the at least one inorganic semiconductor material comprises a material chosen from III-V materials, Si, Ge, CdTe, ZnTe, and copper indium gallium (di)selenide (CIGS).

7. The device of claim 6, wherein the at least one inorganic semiconductor material is chosen from GaAs, InP, GaN, AlN, and InGaAs.

8. The device of claim 1, wherein the inorganic subcell comprises at least one p-n junction and an inorganic energy matching layer positioned between the at least one p-n junction and the organic sensitizing window layer, wherein the inorganic energy matching layer comprises the at least one inorganic semiconductor material, and wherein the band gap energy ($E_G$) of the at least one semiconductor material substantially matches an excitation triplet energy ($E_{T-SF}$) of the singlet fission material.

9. The device of claim 8, wherein the at least one inorganic semiconductor material comprises a III-V material.

10. The device of claim 9, wherein the III-V material is $In_xGa_{1-x}As$, wherein x is chosen such that the band gap energy $E_G$ substantially matches the excitation triplet energy ($E_{T-SF}$) of the singlet fission material.

11. The device of claim 1, wherein the singlet fission material is chosen from polyacenes, rylenes, rubrenes, and biradicaloids.

12. The device of claim 11, wherein the polyacenes are anthracene, tetracene, pentacene, and derivatives thereof, and the biradicaloids are benzofurans.

13. A photosensitive optoelectronic device comprising:
two electrodes;
an inorganic subcell positioned between the two electrodes, wherein the inorganic subcell comprises at least one inorganic semiconductor material having a band gap energy ($E_G$); and
an organic sensitizing window layer disposed on the inorganic subcell and in physical contact with the at least one inorganic semiconductor material, wherein the organic sensitizing window layer comprises a singlet fission material and a phosphorescent emitter dopant,
wherein the singlet fission material exhibits an excitation triplet energy ($E_{T-SF}$) substantially matching the band gap energy ($E_G$), and
wherein the phosphorescent emitter dopant emits radiation at an energy greater than or equal to the band gap energy ($E_G$) of the at least one inorganic semiconductor material such that photons emitted from the phosphorescent emitter dopant are absorbed by the inorganic subcell.

14. The device of claim 13, wherein the inorganic subcell comprises at least one p-n junction and an inorganic energy matching layer positioned between the at least one p-n junction and the organic sensitizing window layer, wherein the inorganic energy matching layer comprises the at least one inorganic semiconductor material, and wherein the band gap energy ($E_G$) of the at least one semiconductor material substantially matches an excitation triplet energy ($E_{T-SF}$) of the singlet fission material.

15. The device of claim 13, wherein the at least one inorganic semiconductor material comprises a III-V material.

16. The device of claim 14, wherein the III-V material is $In_xGa_{1-x}As$, wherein x is chosen such that the band gap energy $E_G$ substantially matches the excitation triplet energy ($E_{T-SF}$) of the singlet fission material.

17. The device of claim 13, wherein the excitation triplet energy is tuned by donor/acceptor substitution.

18. The device of claim 13, wherein the excitation triplet energy is tuned by nitrogen substitution.

* * * * *